US012656280B2

(12) United States Patent
Watanabe et al.

(10) Patent No.: US 12,656,280 B2
(45) Date of Patent: Jun. 16, 2026

(54) METHOD OF EVALUATING PRIMARY OPTICAL SYSTEM OF ELECTRON BEAM OBSERVATION DEVICE, EVALUATION DEVICE USED THEREFOR, AND METHOD OF MANUFACTURING SAME

(71) Applicant: EBARA CORPORATION, Tokyo (JP)

(72) Inventors: Kenji Watanabe, Tokyo (JP); Takeshi Murakami, Tokyo (JP); Yasushi Toma, Tokyo (JP); Ryo Tajima, Tokyo (JP); Tsutomu Karimata, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 378 days.

(21) Appl. No.: 18/326,051

(22) Filed: May 31, 2023

(65) Prior Publication Data

US 2023/0393085 A1 Dec. 7, 2023

(30) Foreign Application Priority Data

Jun. 2, 2022 (JP) ................................. 2022-090326

(51) Int. Cl.
*G01N 23/2251* (2018.01)
*H01J 37/244* (2006.01)
*H01J 37/28* (2006.01)

(52) U.S. Cl.
CPC ........ *G01N 23/2251* (2013.01); *H01J 37/244* (2013.01); *G01N 2223/20* (2013.01); *G01N 2223/418* (2013.01); *H01J 37/28* (2013.01)

(58) Field of Classification Search
CPC ........ H01J 37/28; H01J 37/244; H01J 37/228;

H01J 37/226; H01J 37/21; H01J 37/22; H01J 2237/1501; H01J 2237/1504; G01N 23/2251; G01N 2224/418; G01N 2223/20
See application file for complete search history.

(56) References Cited

U.S. PATENT DOCUMENTS

| | | | |
|---|---|---|---|
| 5,864,142 A * | 1/1999 | Muraki .................. | B82Y 10/00 |
| | | | 250/491.1 |
| 6,313,461 B1 | 11/2001 | Mcclelland et al. | |
| 6,765,217 B1 * | 7/2004 | Nishimura ............ | H01J 37/265 |
| | | | 250/492.2 |
| 7,015,467 B2 * | 3/2006 | Maldonado ......... | H01J 37/3177 |
| | | | 250/311 |
| 10,777,384 B2 * | 9/2020 | Kikuiri ................. | H01J 37/244 |
| 2004/0159787 A1 * | 8/2004 | Nakasuji ................. | H01J 37/28 |
| | | | 250/311 |

(Continued)

FOREIGN PATENT DOCUMENTS

| | | |
|---|---|---|
| JP | 2000-048755 A | 2/2000 |
| JP | 2021-002507 A | 1/2021 |
| WO | 2017/168482 A1 | 10/2017 |

*Primary Examiner* — Wyatt A Stoffa
(74) *Attorney, Agent, or Firm* — Chrisman Gallo Tochtrop LLC

(57) ABSTRACT

Provided is a method of evaluating a deviation of a trajectory of a primary electron beam in a primary optical system in an electron beam observation device including the primary optical system that irradiates a sample with the primary electron beam including a plurality of primary electrons and a secondary optical system that detects, by a detector, a secondary electron beam including a plurality of secondary electrons emitted from the sample irradiated with the primary electron beam.

8 Claims, 10 Drawing Sheets

(56)          References Cited

U.S. PATENT DOCUMENTS

| | | | |
|---|---|---|---|
| 2005/0045821 A1* | 3/2005 | Noji .................... | G01N 23/2204 |
| | | | 250/311 |
| 2006/0197453 A1* | 9/2006 | Nakayama .......... | H01J 37/3045 |
| | | | 315/32 |
| 2008/0099693 A1* | 5/2008 | Platzgummer ...... | H01J 37/3007 |
| | | | 250/398 |
| 2008/0315095 A1* | 12/2008 | Nakasuji ................ | H01J 37/28 |
| | | | 250/310 |
| 2009/0001267 A1* | 1/2009 | Enyama ................ | G01N 23/22 |
| | | | 250/310 |
| 2019/0108969 A1* | 4/2019 | Ogata ..................... | H01J 37/04 |
| 2020/0411279 A1* | 12/2020 | Hayashi ............... | H01J 37/244 |
| 2025/0006459 A1* | 1/2025 | Weiss .................... | H01J 37/153 |
| 2025/0266241 A1* | 8/2025 | Schubert .............. | H01J 37/265 |

* cited by examiner

28

3

3

111   112   113

31

41   32

A   A

33

521   522   523

33

33

METHOD OF EVALUATING PRIMARY OPTICAL SYSTEM OF ELECTRON BEAM OBSERVATION DEVICE, EVALUATION DEVICE USED THEREFOR, AND METHOD OF MANUFACTURING SAME

CROSS-REFERENCE TO RELATED APPLICATIONS

This application claims the benefit of Japanese Priority Patent Application JP 2022-90326 filed on Jun. 2, 2022, the entire contents of which are incorporated herein by reference.

FIELD

The present disclosure relates to a method of evaluating a primary optical system of an electron beam observation device, an evaluation device used for the method, and a method of manufacturing the evaluation device.

BACKGROUND

An electron beam observation device that irradiates a sample with an electron beam and observes the electron beam emitted from the sample is known (for example, JP 2000-48755 A). The electron beam observation device includes a primary optical system that irradiates a sample with a primary electron beam and a secondary optical system that detects a secondary electron beam generated from the sample as an image.

By configuring the primary electron beam in the primary optical system with a plurality of electrons, a high through-put can be achieved. In such an electron beam observation device, it is important to irradiate an accurate position in the sample with the primary electron beam. This is because when a position deviated from an appropriate position is irradiated with electrons, image overlap or omission of inspection may occur.

It is desirable to be able to evaluate the deviation of the trajectory of the electron beam in the primary optical system of the electron beam observation device.

SUMMARY

According to one embodiment of the disclosure,

[1]

provided with a method of evaluating a deviation of a trajectory of a primary electron beam in a primary optical system in an electron beam observation device including the primary optical system that irradiates a sample with the primary electron beam including a plurality of primary electrons and a secondary optical system that detects, by a detector, a secondary electron beam including a plurality of secondary electrons emitted from the sample irradiated with the primary electron beam, the method comprising the steps of:

irradiating an irradiation target with a primary electron beam generated by a multiple beam generation mechanism provided with a plurality of openings, and acquiring a first image formed by a secondary electron beam from the irradiation target, the first image including a plurality of first patterns each of which corresponding to each of the openings provided in the multiple beam generation mechanism;

calculating a first deviation amount between a position of each of the first patterns in the first image and a target position of the first pattern;

irradiating with light a plurality of photoelectric converters each of which corresponding to each of the plurality of openings provided in the multiple beam generation mechanism and installed on a stage of the electron beam observation device, and acquiring a second image formed by an electron beam from the photoelectric converters, the second image including a plurality of second patterns each of which corresponding to each of the photoelectric converters;

calculating a second deviation amount between a position of each of the second patterns in the second image and a target position of the second pattern; and obtaining a deviation of a trajectory of the primary electron beam in the primary optical system based on the first deviation amount and the second deviation amount.

According to one embodiment of the disclosure,

[2]

provided with a method of evaluating a deviation of a trajectory of a primary electron beam in a primary optical system in an electron beam observation device including the primary optical system that irradiates a sample with the primary electron beam including a plurality of primary electrons and a secondary optical system that detects, by a detector, a secondary electron beam including a plurality of secondary electrons emitted from the sample irradiated with the primary electron beam, the method comprising the steps of:

irradiating an irradiation target with a primary electron beam from a plurality of electron sources, and acquiring a first image formed by a secondary electron beam from the irradiation target, the first image including a plurality of first patterns each of which corresponding to each of arrangements of the plurality of electron sources;

calculating a first deviation amount between a position of each of the first patterns in the first image and a target position of the first pattern;

irradiating with light a plurality of photoelectric converters installed on a stage of the electron beam observation device and each corresponding to the arrangement of the plurality of electron sources, and acquiring a second image formed by an electron beam from the photoelectric converters, the second image including a plurality of second patterns each of which corresponding to each of the photoelectric converters;

calculating a second deviation amount between a position of each of the second patterns in the second image and a target position of the second pattern; and obtaining a deviation of a trajectory of the primary electron beam in the primary optical system based on the first deviation amount and the second deviation amount.

[3]

The evaluation method according to [1] or [2], it is preferable that a position of each of the first patterns in the first image deviates from a target position depending on a deviation of a trajectory of the primary electron beam in the primary optical system and a deviation of a trajectory of the secondary electron beam in the secondary optical system, and a position of each of the second patterns in the second image deviates from a target position depending on a deviation of a trajectory of the secondary electron beam in the secondary optical system, but does not depend on a deviation of a trajectory of the primary electron beam in the primary optical system.

[4]

The evaluation method according to any one of [1] to [3], wherein the irradiation target may be a stage of the electron beam observation device.

[5]

The evaluation method according to any one of [1] to [3], wherein the plurality of photoelectric converters may be provided on a substrate, and the irradiation target may be a part of the substrate where the photoelectric converters are not provided.

According to one embodiment of the disclosure,

[6]

provided is an evaluation device used to evaluate a deviation of a trajectory of a primary electron beam in a primary optical system in an electron beam observation device including the primary optical system that irradiates a sample with the primary electron beam including a plurality of primary electrons and a secondary optical system that detects, by a detector, a secondary electron beam including a plurality of secondary electrons emitted from the sample irradiated with the primary electron beam, the evaluation device comprising a plurality of photoelectric converters each of which corresponding to each of a plurality of openings provided in a multiple beam generation mechanism that generates the primary electron beam.

According to one embodiment of the present disclosure,

[7]

provided with an evaluation device used to evaluate a deviation of a trajectory of a primary electron beam in a primary optical system in an electron beam observation device including the primary optical system that irradiates a sample with the primary electron beam including a plurality of primary electrons and a secondary optical system that detects, by a detector, a secondary electron beam including a plurality of secondary electrons emitted from the sample irradiated with the primary electron beam, the evaluation device comprising a plurality of photoelectric converters each of which corresponding to each of an arrangement of a plurality of electron sources that emit the primary electron beam.

[8]

The evaluation device according to [6] or [7], it is preferable that a substrate is provided, and the photoelectric converters are disposed in a hole provided in the substrate.

[9]

The evaluation device according to any one of [6] to [8], in which it is desirable that a substrate is provided, and a surface of the substrate and a surface of each of the photoelectric converters are flush with each other.

According to one embodiment of the present disclosure,

[10]

provided is a method of manufacturing an evaluation device used to evaluate a deviation of a trajectory of a primary electron beam in a primary optical system in an electron beam observation device including the primary optical system that irradiates a sample with the primary electron beam including a plurality of primary electrons and a secondary optical system that detects, by a detector, a secondary electron beam including a plurality of secondary electrons emitted from the sample irradiated with the primary electron beam, the method including the steps of:

a step of forming a photoelectric conversion material film on a light transmissive base material;

patterning the formed photoelectric conversion material film to form a plurality of photoelectric converters respectively corresponding to a plurality of openings provided in a multiple beam generation mechanism that generates the primary electron beam; and disposing the base material on which the photoelectric converters are formed in a hole formed in a substrate.

According to one aspect of the present disclosure,

[11]

provided is a method of manufacturing an evaluation device used to evaluate a deviation of a trajectory of a primary electron beam in a primary optical system in an electron beam observation device including the primary optical system that irradiates a sample with the primary electron beam including a plurality of primary electrons and a secondary optical system that detects, by a detector, a secondary electron beam including a plurality of secondary electrons emitted from the sample irradiated with the primary electron beam, the method comprising the steps of:

a step of forming a photoelectric conversion material film on a light transmissive base material;

patterning the formed photoelectric conversion material film to form a plurality of photoelectric converters respectively each of which corresponding to each of a plurality of electron sources that emit the primary electron beam; and disposing the base material on which the photoelectric converters are formed in a hole formed in a substrate.

DETAILED DESCRIPTION OF EXEMPLARY EMBODIMENTS

Hereinafter, embodiments according to the present invention will be specifically described with reference to the drawings.

First Embodiment

Figure 1A:
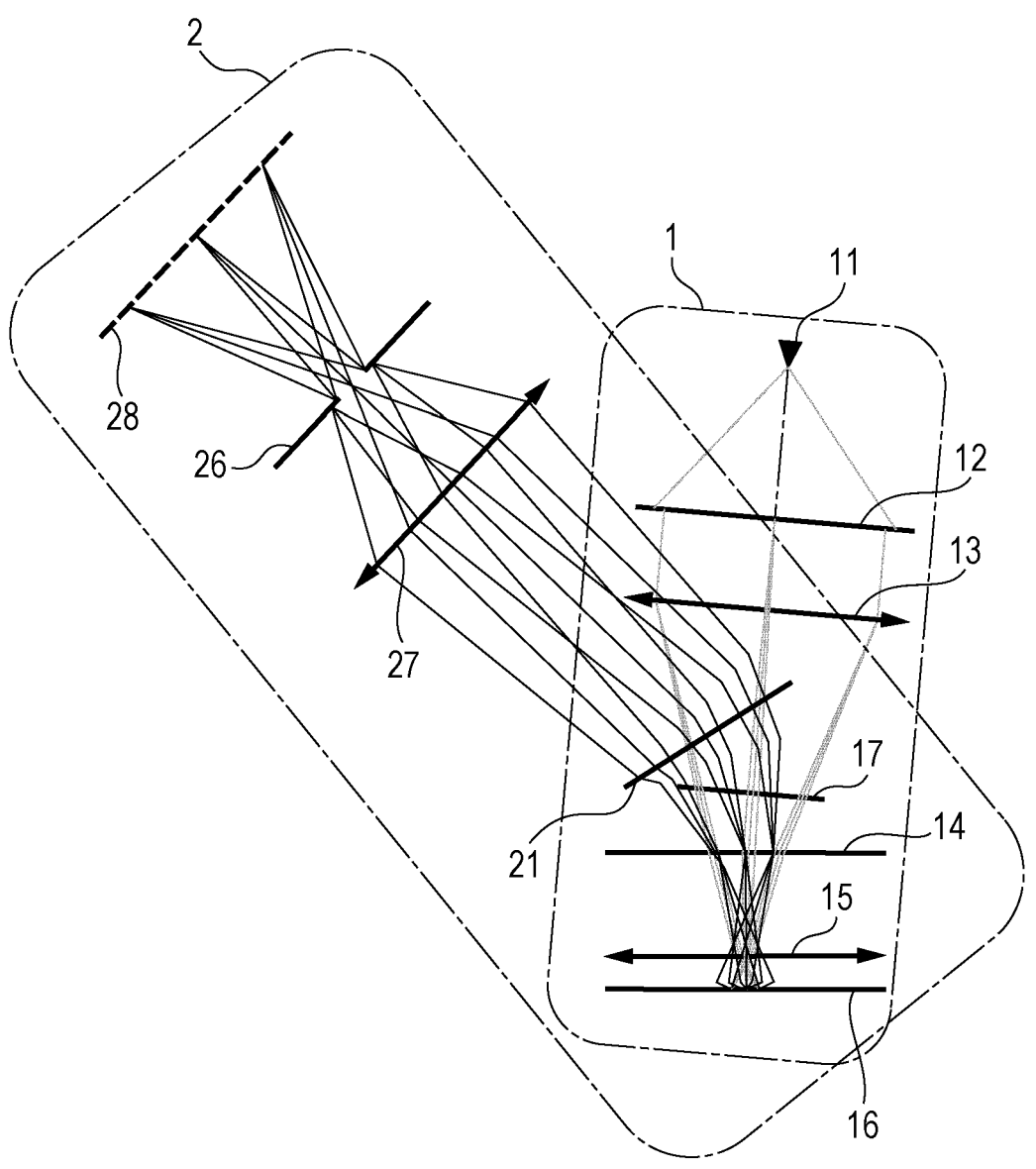
FIG. 1A is a schematic configuration diagram of an electron beam observation device according to a first embodiment.

FIG. 1A is a schematic configuration diagram of an electron beam observation device according to a first embodiment. This electron beam observation device is, for example, a scanning electron microscope (SEM), and includes a primary optical system 1 (also referred to as an irradiation system or a multiple beam optical system) and a secondary optical system 2 (also referred to as an imaging system or a projection optical system).

The primary optical system 1 focuses and emits a primary electron beam including a plurality of primary electrons to a plurality of positions of a sample placed on a stage 16, and includes an electron source 11, a multiple beam generation mechanism 12, a transfer lens 13, a beam separator 14, an objective lens 15, the stage 16, a scan deflector 17, and the like.

The electron beam emitted from the electron source 11 is appropriately accelerated by an accelerator (not illustrated) and expanded by a lens (not illustrated), and is incident on the multiple beam generation mechanism 12. The multiple beam generation mechanism 12 has a plurality of openings (described later), and the electron beam from the electron source 11 passes through these openings to generate a primary electron beam including a plurality of primary electrons. The generated primary electron beam is individually focused by the transfer lens 13, the beam separator 14, and the objective lens 15, and a plurality of places of the sample placed on the stage 16 is irradiated with the primary electron beam discretely at equal intervals.

Furthermore, the primary electron beam is deflected by the scan deflector 17 so as to scan the sample two-dimensionally. As a result, the sample is uniformly irradiated with the primary electron beam emitted discretely.

The secondary optical system 2 detects, by a detector 28, a secondary electron beam including a plurality of secondary electrons emitted from a sample irradiated with the primary electron beam, and includes the objective lens 15, the beam separator 14, a beam bender 21, a projection lens 27, an aperture diaphragm 26, the detector 28, and the like. Note that the objective lens 15 and the beam separator 14 are shared with the primary optical system 1.

The secondary electron beam from the sample is focused by the objective lens 15. Then, the secondary electron beam is bent in a direction different from that of the primary optical system 1 by the beam separator 14 forming a superimposed field of the electric field and the magnetic field. The secondary electron beam is further bent by the beam bender 21.

The secondary electron beam is brought close to the vicinity of an optical axis by the projection lens 27. The aperture diaphragm 26 is disposed at a position where the plurality of secondary electrons are closest to each other at a center of the optical axis.

The aperture diaphragm 26 has an aperture, and only the secondary electron beam that has passed through the aperture reaches the projection lens 27. As a result, an opening angle of the secondary electron beam is defined.

Figure 1B:
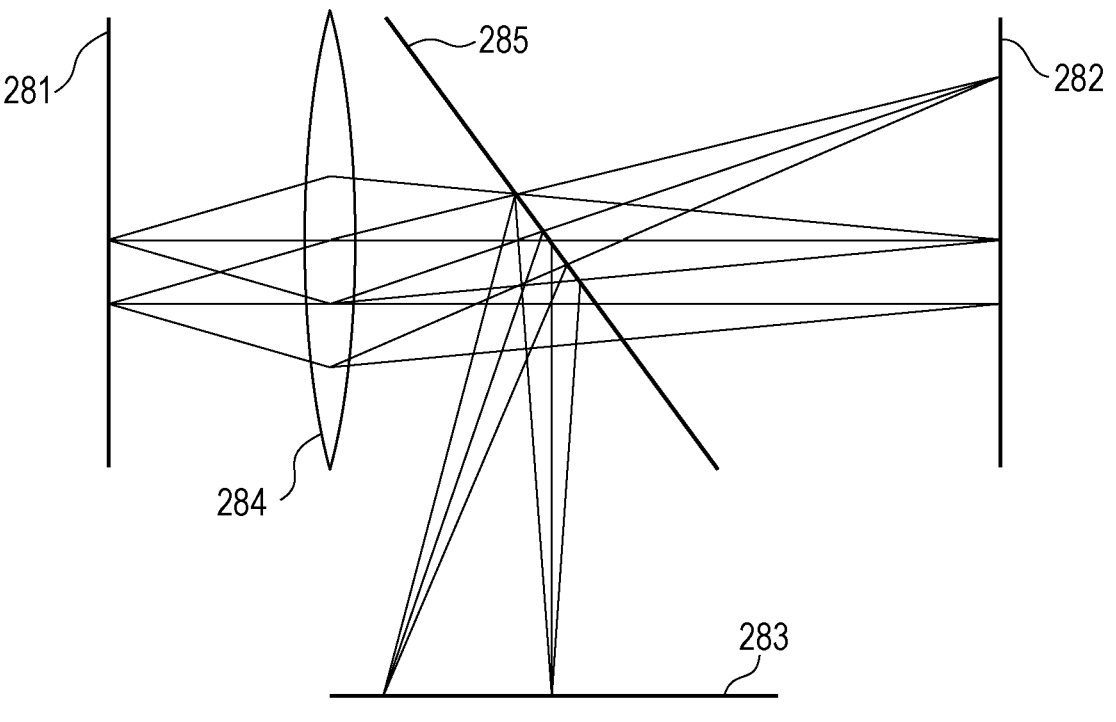
FIG. 1B is a schematic configuration diagram of a detector 28.

As illustrated in FIG. 1B, the detector 28 includes, for example, a scintillator 281, an optical amplifier 282, an image sensor 283 (for example, a CMOS image sensor), a magnifying lens 284, and a half mirror 285.

Secondary electrons emitted from a plurality of places on the sample are imaged on the scintillator 281, and light corresponding to an amount of secondary electron beams reaching the scintillator 281 is generated from the scintillator 281. Since the generated light is divergent light, the light is enlarged and projected using the magnifying lens 284 disposed in the optical path. A part of the light having passed through the magnifying lens 284 passes through the half mirror 285 and travels toward the optical amplifier 282 via a bundle of optical fibers, and a part of the light is reflected by the half mirror 285 and travels toward the image sensor 283. The former light is converted into an electric signal by the amplifier 282, and a scanning image (SEM image) of the number of beams corresponding to the amount of the secondary electron beams is formed. The latter light forms an image on the image sensor 283, and the image by the secondary electron beam is obtained.

Figure 1C:
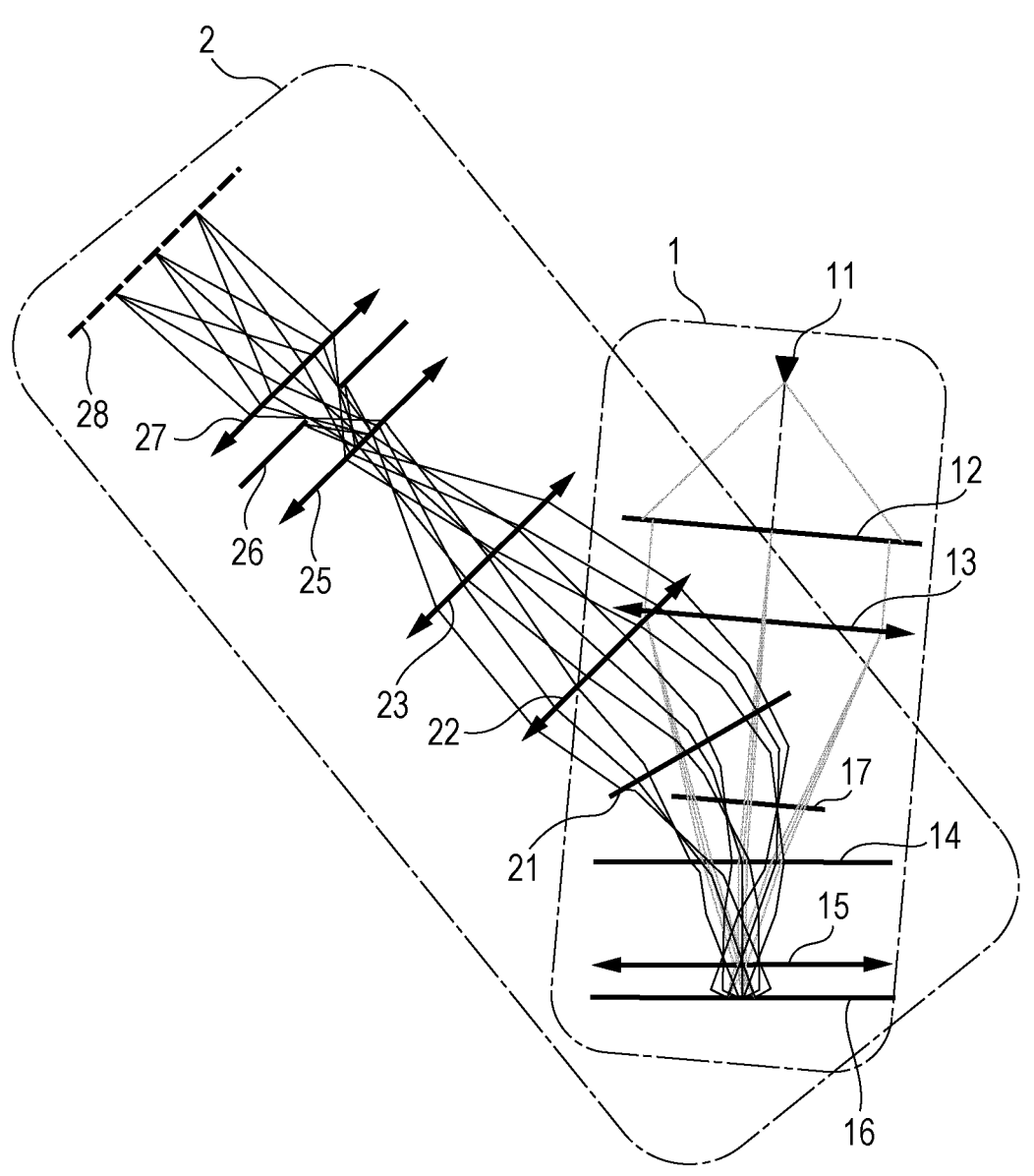
FIG. 1C is a schematic configuration diagram of an electron beam observation device according to a modification example of FIG. 1A.

FIG. 1C is a schematic configuration diagram of an electron beam observation device according to a modification example of FIG. 1A. As illustrated, a first relay lens 22, a second relay lens 23, and a field lens 25 may be added to the electron beam observation device of FIG. 1A. In this case, the projection lens 27 is disposed between the aperture diaphragm 26 and the detector 28.

In the electron beam observation device of FIG. 1C, the first relay lens 22 and the second relay lens 23 perform adjustment such that the secondary electron beam forms an image at a constant position in the vicinity of a lens main surface of the field lens 25 with a constant size regardless of a potential of the sample. By providing the first relay lens 22 and the second relay lens 23, it is possible to cope with a wide range of sample potentials.

In the vicinity of the position of the aperture diaphragm 26, the field lens 25 generates an electric field or a magnetic field to adjust a trajectory of the secondary electron beam such that the plurality of secondary electrons constituting the secondary electron beam are closest to each other at the center of the optical axis. In other words, the aperture diaphragm 26 is disposed at a position where the plurality of secondary electrons are closest to each other at the center of the optical axis.

The projection lens 27 images the secondary electron beam on the detector 28, which has passed through the aperture of the aperture diaphragm 26.

Figure 2:
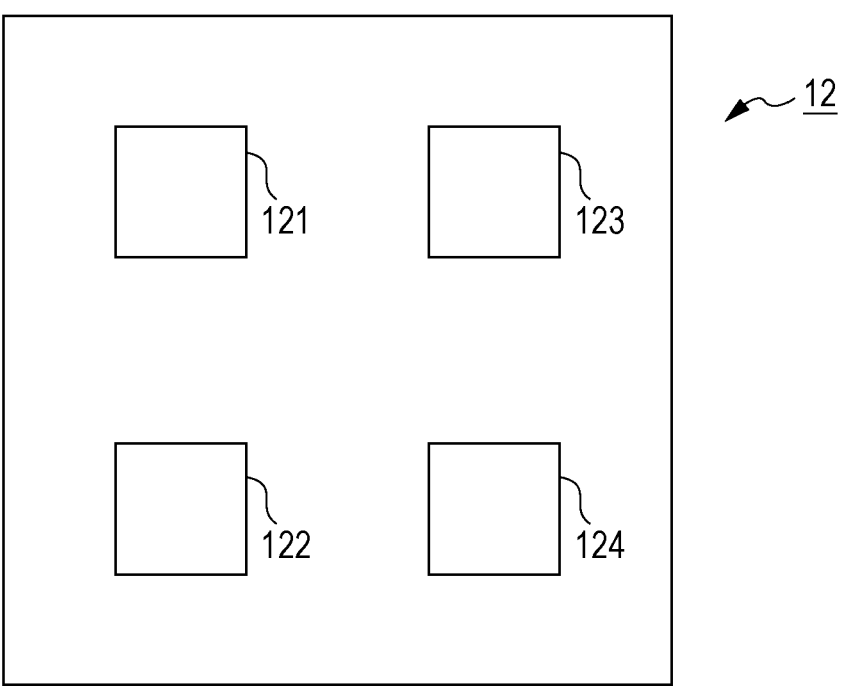
FIG. 2 is a schematic diagram of a multiple beam generation mechanism 12 in the electron beam observation device of FIG. 1.

FIG. 2 is a schematic diagram of the multiple beam generation mechanism 12 in the electron beam observation device of FIG. 1. As illustrated, the multi-beam generating mechanism 12 has a plurality of (four in FIG. 2) openings 121 to 124. By irradiating an entire surface of the multiple beam generation mechanism 12 with an electron beam from the electron source 11, a primary electron beam including a plurality of primary electrons passing through the plurality of openings 121 to 124 is obtained.

Note that in FIG. 2 and the following description, the multiple beam generation mechanism 12 having four openings 121 to 124 will be described as an example for simplification, but the number of openings is not particularly limited and may be several to 1000 or more.

In the electron beam observation device that irradiates a sample with a primary electron beam including a plurality of electrons, it is important to irradiate an accurate position in the sample with electrons. This is because the optical fiber in the detector 28 is provided corresponding to each of the openings 121 to 124 of the multiple beam generation mechanism 12, but in a case where electrons are not emitted to an accurate position, the light cannot be received by the optical fiber (leading to a decrease in sensitivity), or the light may be received by a non-corresponding optical fiber (crosstalk of an image occurs).

However, in the primary optical system 1, when the primary electron beam passes through the transfer lens 13, the beam separator 14, and the objective lens 15, the trajectory of the primary electron beam may deviate (distort) from the assumption. For example, in a case where the transfer lens 13 is disposed to be shifted from the original position, the primary electron beam passes through a position shifted from a center of the transfer lens 13, and the irradiation position is deviated. Since this deviation causes overlap or omission of an inspection region, it is necessary to adjust an inspection accuracy to be necessary.

Therefore, the primary optical system 1 is provided with an aligner (not illustrated) for canceling the deviation of the trajectory of the primary electron beam in the transfer lens 13, the beam separator 14, and the objective lens 15. Then, in order to grasp how to adjust the trajectory of the primary electron beam by the aligner, it is necessary to evaluate the deviation of the trajectory of the primary electron beam in the primary optical system 1.

However, also in the secondary optical system 2, when the secondary electron beam passes through the objective lens 15, the beam separator 14, the beam bender 21, the first relay lens 22, the second relay lens 23, the field lens 25, and the projection lens 27, a trajectory of the secondary electron beam may be deviated (distorted) from the assumption. Therefore, in the image obtained by the image sensor 283, the deviation in the primary optical system 1 and the deviation in the secondary optical system 2 are superimposed.

Therefore, in the present embodiment, only the deviation in the primary optical system 1 is evaluated as described below.

Figure 3A:
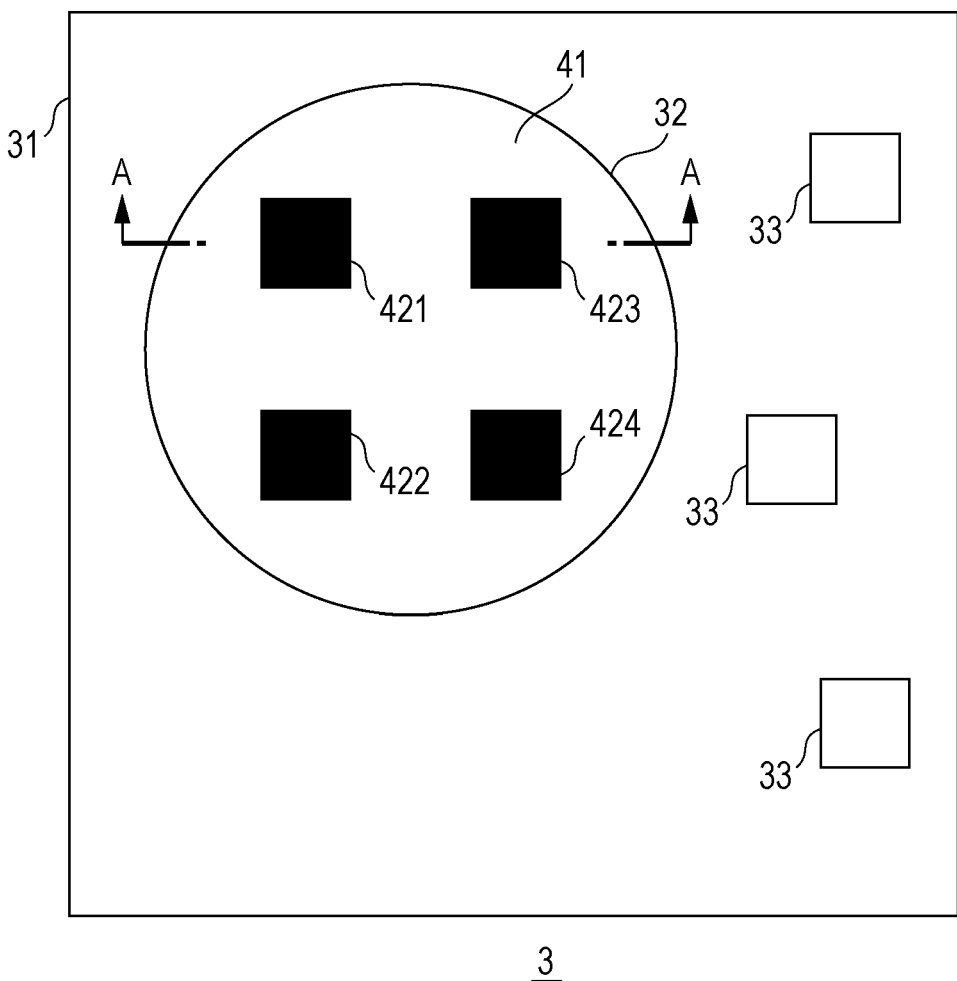
FIG. 3A is a plan view of a sample plate 3 used in an evaluation according to the present embodiment.
Figure 3B:
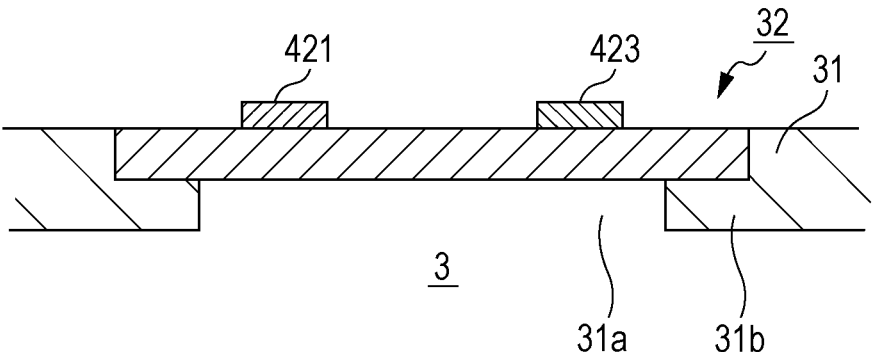
FIG. 3B is a cross-sectional view taken along line A-A of FIG. 3A.

FIG. 3A is a plan view of a sample plate 3 (evaluation device) used in the evaluation according to the present embodiment. Furthermore, FIG. 3B is a cross-sectional view taken along line A-A of FIG. 3A. The sample plate 3 is placed on the stage 16 of the electron beam observation device of FIG. 1.

The sample plate 3 includes, for example, a substrate 31 made of aluminum and a photocathode 32. As illustrated in FIG. 3B, a hole 31a is formed in the substrate 31, and the photocathode 32 is embedded in the hole 31a. More specifically, the substrate 31 has a shoulder 31b toward the hole 31a, and the photocathode 32 is disposed on the shoulder 31b.

The photocathode 32 includes a light transmissive base material 41 and a plurality of photoelectric converters 421 to 424. The light transmissive base material 41 is made of, for example, glass, quartz, or sapphire (sapphire having high thermal conductivity is particularly preferable), and has a thickness of about 3 mm to 5 mm. Each of the photoelectric converters 421 to 424 is formed of, for example, a metal film of gold, platinum, ruthenium, or the like, and has a thickness of about 5 nm to 100 nm. In order to increase the electron generation efficiency, CsBr or the like having a thickness of about 5 nm to 20 nm may be further provided on an upper surface of each of the photoelectric converters 421 to 424 in addition to the metal film.

The plurality of photoelectric converters 421 to 424 respectively correspond to the openings 121 to 124 of the multiple beam generation mechanism 12. More specifically, an arrangement position, shape, and size of each of the photoelectric converters 421 to 424 correspond to the opening 121 to 124 of the multiple beam generation mechanism 12 illustrated in FIG. 2, respectively. It is desirable that an upper surface of the substrate 31 and an upper surface of the light transmissive base material 41 in the photocathode 32 are flush with each other. If the upper surface of the substrate 31 and the upper surface of the light transmitting base material 41 are shifted, the electric field becomes non-uniform, which may cause discharge between the objective lens 15 and the stage 16, or may cause beam misalignment or aberration due to disturbance of an electron trajectory. Note that the upper surface of the substrate 31 and an upper surface of each of the photoelectric converters 421 to 424 may be shifted from each other.

When light is irradiated from a lower surface of the photocathode 32, electrons are generated from the photoelectric converters 421 to 424 due to a photoelectric effect. On the other hand, electrons are not generated from portions other than the photoelectric converters 421 to 424. Here, the light to be irradiated needs to be excited to be higher than the work function of a material constituting the photoelectric converters 421 to 424, and may be light having a wavelength lower than 265 nm, laser light, an ultraviolet lamp, or a mercury lamp.

Such a photocathode 32 is manufactured, for example, by forming (for example, depositing) a photoelectric conversion material on glass to be the light transmissive base material 41, and patterning the photoelectric conversion material so as to correspond to each of the openings 121 to 124 in the multiple beam generation mechanism 12 using a lithography technology.

Note that, in the sample plate 3, one or more chips 33 used for other evaluations may be embedded in holes formed in the substrate 31. In any case, the sample plate 3 may include at least the plurality of photoelectric converters 421 to 424 respectively corresponding to the plurality of openings 121 to 124 provided in the multiple beam generation mechanism 12.

Figure 4:
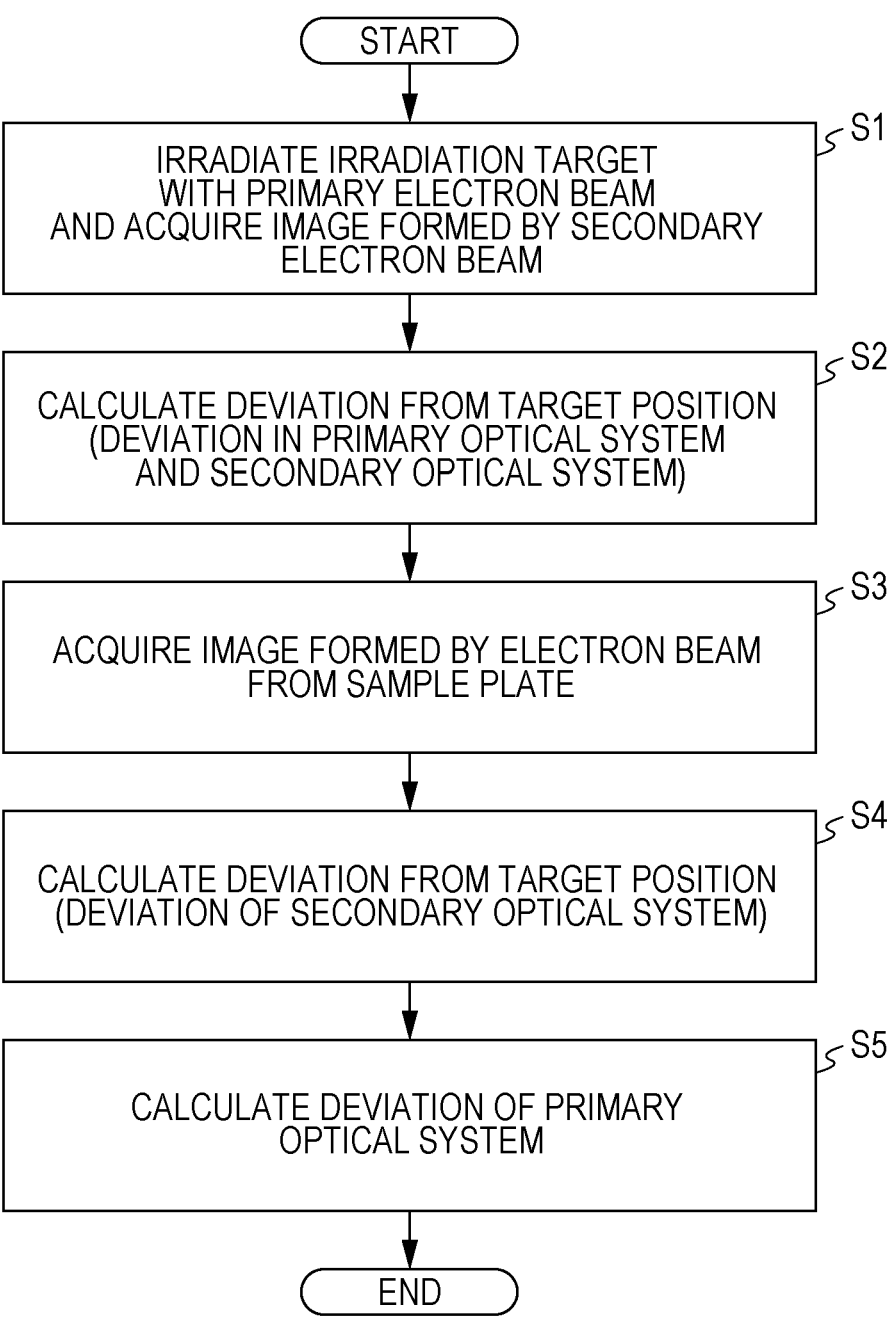
FIG. 4 is a flowchart illustrating a procedure of an evaluation method according to the present embodiment.

FIG. 4 is a flowchart illustrating a procedure of an evaluation method according to the present embodiment. Note that the procedure in the drawing is an example, and the order may be appropriately changed.

First, an irradiation target is irradiated with the primary electron beam, and an image formed on the image sensor 283 by the secondary electron beam from the irradiation target is acquired (step S1). Note that the irradiation target may be a surface of the stage 16 of the electron beam observation device.

Figure 5A:
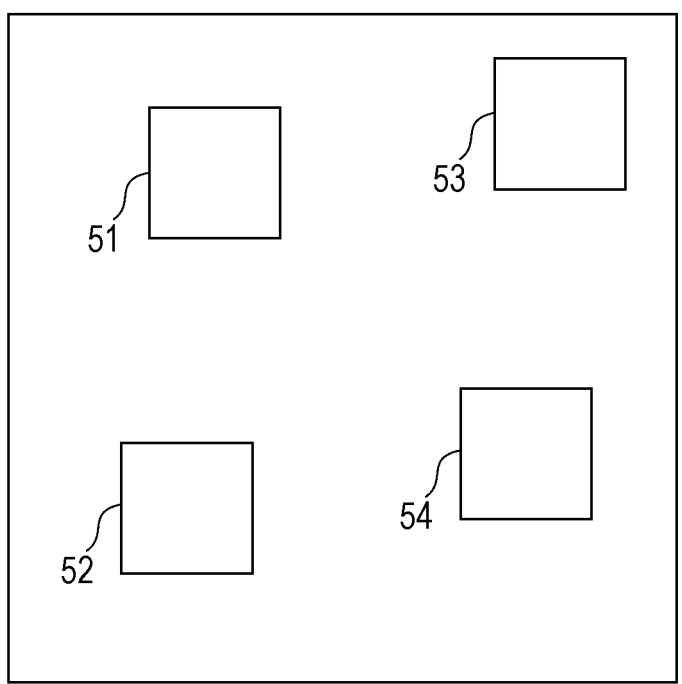
FIG. 5A is a diagram schematically illustrating an image obtained in step S1.

FIG. 5A is a diagram schematically illustrating the image obtained in step S1. This image includes a plurality of patterns 51 to 54 respectively corresponding to the openings 121 to 124 in the multiple beam generation mechanism 12.

Figure 5B:
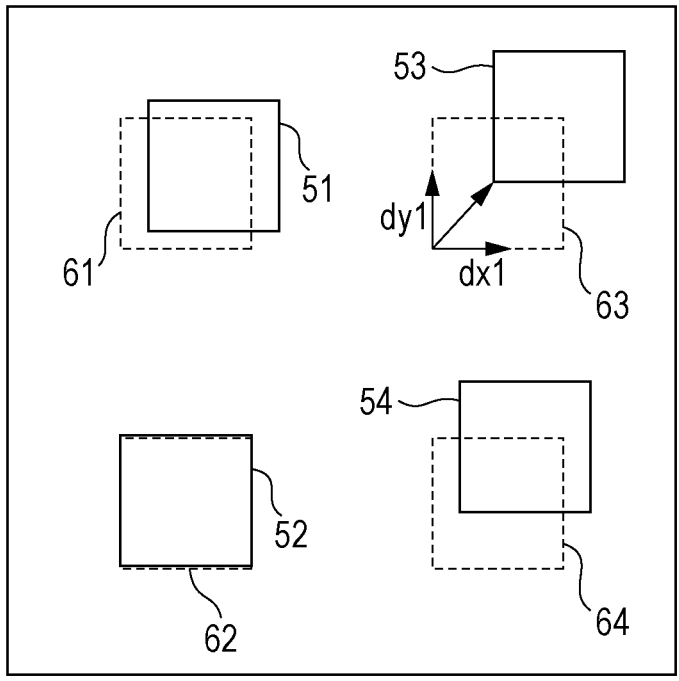
FIG. 5B is a diagram illustrating the image obtained in step S1 and target positions 61 to 64 (indicated by a broken line) of patterns 51 to 54 in an overlapping manner.

FIG. 5B is a diagram illustrating the image obtained in step S1 and target positions 61 to 64 (indicated by a broken line) of the patterns 51 to 54 in an overlapping manner. The target positions 61 to 64 are positions where the pattern 51 to 54 respectively corresponding to the openings 121 to 124 in the multiple beam generation mechanism 12 should be formed in a case where a deviation of the electron beam does not occur in the primary optical system 1 and the secondary optical system 2.

As illustrated, the patterns 51 to 54 in the image obtained in step S1 are deviated from the target positions 61 to 64. This deviation is caused by a deviation of the trajectory of the primary electron beam in the primary optical system 1 and a deviation of the trajectory of the secondary electron beam in the secondary optical system 2.

Returning to FIG. 4, an amount of deviation between a position of each of the patterns 51 to 54 in the image acquired in step S1 and each of the target positions 61 to 64 is calculated (step S2). The deviation amount includes a deviation caused by the deviation in the primary optical system 1 and a deviation caused by the deviation in the secondary optical system 2.

For example, as illustrated in FIG. 5B, the pattern 53 and a deviation dx1 in an x direction and a deviation dy1 in a y direction of the target position 63 are calculated. This calculation may be performed manually by an operator or may be performed by appropriate image processing. Furthermore, it is desirable to calculate the deviations from the target positions 61 to 64 for all of the patterns 51 to 54, but the deviations from the target positions 61 to 64 may be calculated for only a part of the patterns 51 to 54.

Subsequently, the sample plate 3 is placed on the stage 16 of the electron beam observation device. Then, by irradiating light from below the sample plate 3, an electron beam is generated from the photoelectric converters 421 to 424. This electron beam simulates a secondary electron beam emitted from the sample. Then, an image formed on the image sensor 283 by the electron beam from the photoelectric converters 421 to 424 is acquired (step S3).

Figure 6A:
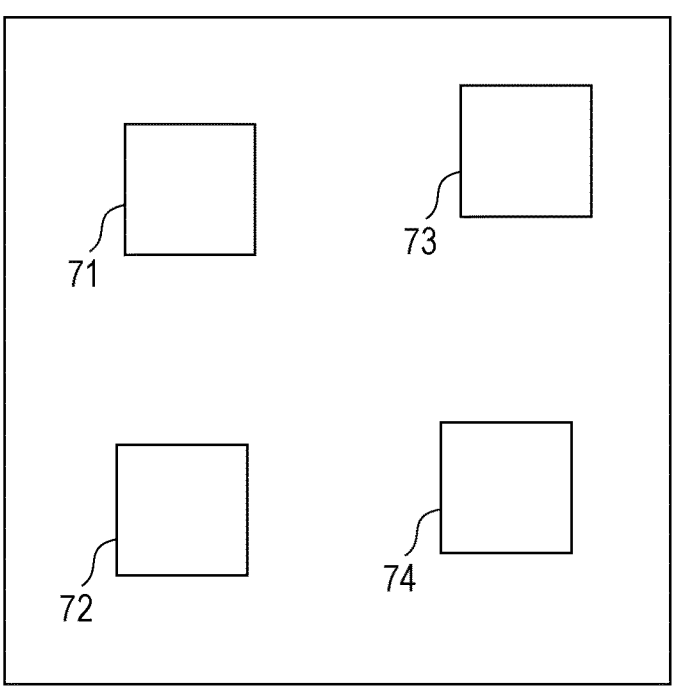
FIG. 6A is a diagram schematically illustrating an image obtained in step S3.

FIG. 6A is a diagram schematically illustrating the image obtained in step S3. This image includes a plurality of patterns 71 to 74 respectively corresponding to the photoelectric converters 421 to 424 in the sample plate 3.

Figure 6B:
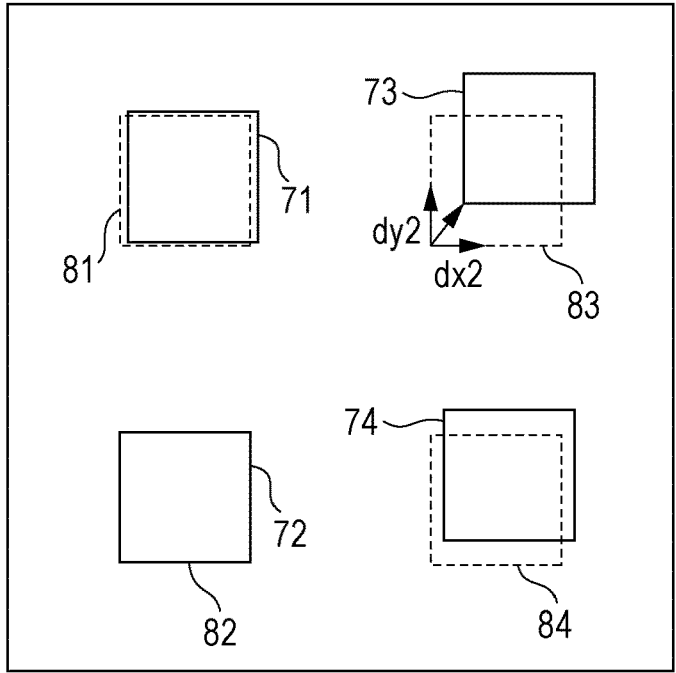
FIG. 6B is a diagram illustrating the image obtained in step S3 and target positions 81 to 84 of patterns 71 to 74 in an overlapping manner.

FIG. 6B is a diagram illustrating the image obtained in step S3 and target positions 81 to 84 of the patterns 71 to 74 in an overlapping manner. The target positions 81 to 84 are positions where the patterns 71 to 74 respectively corresponding to the photoelectric converters 421 to 424 in the sample plate 3 should be formed in a case where a deviation of the electron beam does not occur in the primary optical system 1 and the secondary optical system 2, and respectively corresponds to the target positions 61 to 64 in FIG. 5B.

Returning to FIG. 4, an amount of deviation between a position of each of the patterns 71 to 74 in the image acquired in step S3 and each of the target positions 81 to 84 is calculated (step S4). This deviation amount does not depend on the deviation of the trajectory of the primary electron beam in the primary optical system 1, and is caused by the deviation of the trajectory of the secondary electron beam in the secondary optical system 2.

For example, as illustrated in FIG. 6B, the pattern 73 and a deviation dx2 in the x direction and a deviation dy2 in the y direction of the target position 83 are calculated. This calculation may be performed manually by an operator or may be performed by appropriate image processing. Furthermore, it is desirable to calculate the deviations from the target positions 81 to 84 for all of the patterns 71 to 74, but the deviations from the target positions 81 to 84 may be calculated for only a part of the patterns 71 to 74.

Then, the deviation of the trajectory of the primary electron beam in the primary optical system 1 is obtained from the deviation amount calculated in step S2 and the deviation amount calculated in step S4 (step S5). As a specific example, a difference between both deviation amounts (dx1−dx2 and dy1−dy2) is the deviation amount of the trajectory of the primary electron beam in the primary optical system 1.

Note that, in step S1, the sample plate 3 may be placed on the stage 16 in advance, and a portion of the sample plate 3 where the photoelectric converters 421 to 424 are not formed may be set as an irradiation target.

As described above, according to the present embodiment, since the image by the electron beam passing through the primary optical system 1 and the secondary optical system 2 is compared with the image by the electron beam passing only through the secondary optical system 2, it is possible to evaluate the deviation of the trajectory of the electron beam in the primary optical system 1. Then, the deviation of the trajectory of the electron beam in the primary optical system 1 can be canceled by the aligner in the primary optical system 1. As a result, it is possible to realize the primary optical system 1 capable of accurately irradiating the primary electron beam, and for example, it is possible to lead to independent manufacture and sales of only the primary optical system 1.

Second Embodiment

In the first embodiment described above, the primary electron beam including the plurality of primary electrons is generated using the multiple beam generation mechanism 12 having the plurality of openings. On the other hand, in a second embodiment to be described next, a primary electron beam is generated by a plurality of electron sources 11 instead of the multiple beam generation mechanism 12. Hereinafter, common points with the first embodiment will be omitted or simplified, and differences will be mainly described.

Figure 7:
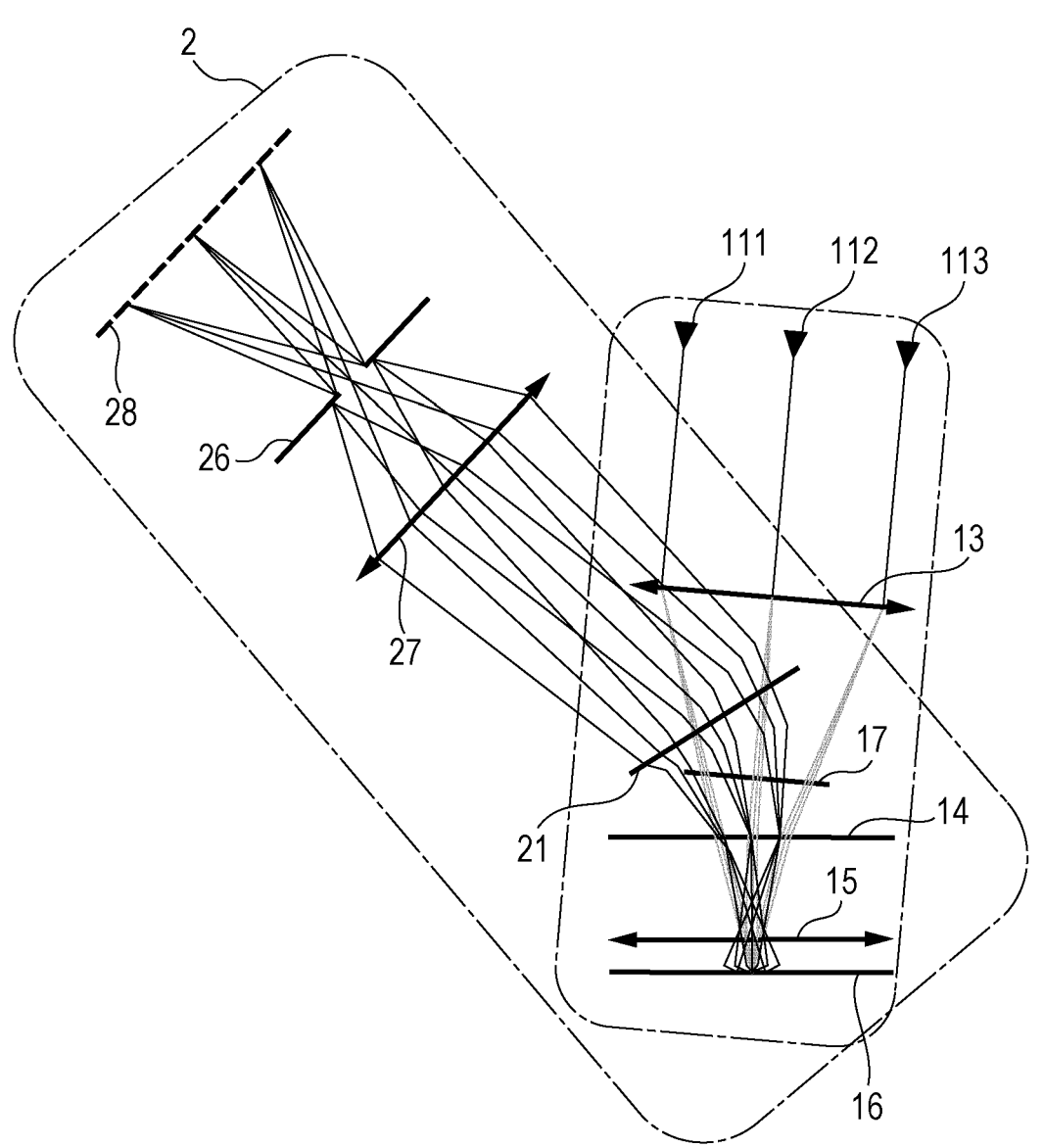
FIG. 7 is a schematic configuration diagram of an electron beam observation device according to a second embodiment.

FIG. 7 is a schematic configuration diagram of an electron beam observation device according to a second embodiment. The present electron beam observation device includes a plurality of electron sources 111 to 113 instead of the multiple beam generation mechanism 12 of FIG. 1A. Each of the electron sources 111 to 113 emits one electron beam. As a result, a primary electron beam including a plurality of primary electrons is generated.

Note that although three electron sources 111 to 113 are schematically illustrated in FIG. 7, the number thereof is not particularly limited and may be several to 1000 or more. Furthermore, the plurality of electron sources 111 to 113 may be provided instead of the multiple beam generation mechanism 12 of the electron beam observation device illustrated in FIG. 1C.

Figures 8, 9:
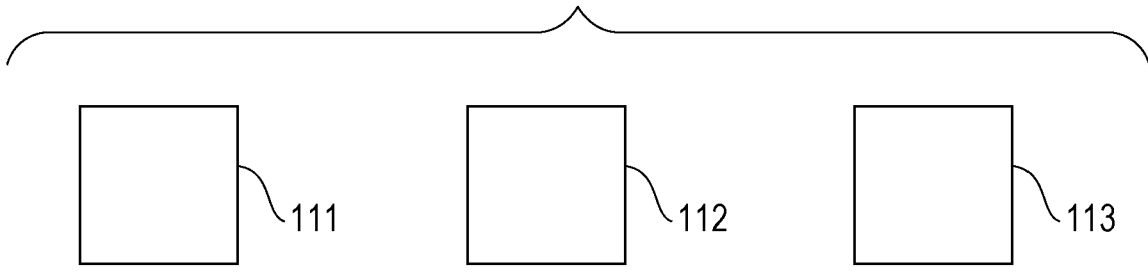
FIG. 8 is a diagram schematically illustrating an arrangement of electron sources 111 to 113.
FIG. 9 is a plan view of a sample plate 3 used in an evaluation according to the present embodiment.

FIG. 8 is a schematic diagram of the electron sources 111 to 113 as viewed from below. As illustrated, the three electron sources 111 to 113 are arranged in a line. In the present embodiment, the sample plate 3 (FIG. 3A) described in the first embodiment can be used. However, as illustrated in FIG. 9, photoelectric converters 521 to 523 of the sample plate 3 each corresponds to an arrangement of the electron sources 111 to 113. For example, when the three electron sources 111 to 113 are arranged in a line as illustrated in FIG. 8, the photoelectric converters 521 to 523 of the sample plate 3 are also arranged in a line as illustrated in FIG. 9.

A procedure of an evaluation method in the present embodiment may be similar to that illustrated in FIG. 4, and thus will be briefly described.

First, an irradiation target is irradiated with the primary electron beam, and an image formed on the image sensor

283 by the secondary electron beam from the irradiation target is acquired (step S1). Note that the irradiation target may be a surface of the stage 16 of the electron beam observation device. The image acquired here includes a plurality of patterns each corresponding to the arrangement of the electron source 111 to 113.

Subsequently, an amount of deviation between a position of each of the patterns in the image acquired in step S1 and each of the target positions is calculated (step S2). The deviation amount includes a deviation caused by the deviation in the primary optical system 1 and a deviation caused by the deviation in the secondary optical system 2.

Next, the sample plate 3 is placed on the stage 16 of the electron beam observation device. Then, by irradiating light from below the sample plate 3, an electron beam is generated from the photoelectric converters 521 to 523. This electron beam simulates a secondary electron beam emitted from the sample. Then, an image formed on the image sensor 283 by the electron beam from the photoelectric converters 521 to 523 is acquired (step S3).

The image acquired here includes a plurality of patterns respectively corresponding to the photoelectric converters 521 to 523 in the sample plate 3.

Then, an amount of deviation between a position of each of the patterns in the image acquired in step S3 and each of the target positions is calculated (step S4). This deviation amount does not depend on the deviation of the trajectory of the primary electron beam in the primary optical system 1, and is caused by the deviation of the trajectory of the secondary electron beam in the secondary optical system 2.

Then, the deviation of the trajectory of the primary electron beam in the primary optical system 1 is obtained from the deviation amount calculated in step S2 and the deviation amount calculated in step S4 (step S5). As a specific example, a difference between both the deviation amounts is the deviation amount of the trajectory of the primary electron beam in the primary optical system 1.

Note that, in step S1, the sample plate 3 may be placed on the stage 16 in advance, and a portion of the sample plate 3 where the photoelectric converters 521 to 523 are not formed may be set as an irradiation target.

According to the second embodiment, even in the electron source observation device that generates the primary electron beam by the plurality of electron sources 111 to 113, it is possible to realize the primary optical system 1 capable of accurately irradiating the primary electron beam, and for example, it is possible to lead to independent manufacturing and sales of only the primary optical system 1.

Based on the above description, a person skilled in the art may be able to conceive additional effects and various modification examples of the present invention, but aspects of the present invention are not limited to the individual embodiments described above. Various additions, modifications, and partial deletions can be made without departing from the conceptual idea and spirit of the present invention derived from the contents defined in the claims and equivalents thereof.

For example, what (including what is depicted in the drawings as a single device) is described herein as a single device (or component, same hereafter) may be implemented by a plurality of devices. Conversely, what (including what is depicted in the drawings as a plurality of devices) is described herein as a plurality of devices may be realized by one device. Alternatively, some or all of the means and functions included in a certain device may be included in another device.

Furthermore, not all the matters described in the present specification are essential requirements. In particular, matters described in the present specification and not recited in the claims can be regarded as any additional matters.

It should be noted that the applicant of the present invention is merely aware of the invention disclosed in the document in the column of "BACKGROUND" in the present specification, and the present invention is not necessarily intended to solve the problem in the invention disclosed in the document. The problem to be solved by the present invention should be recognized in consideration of the entire specification. For example, in the present specification, in a case where there is a description that a predetermined effect is exhibited by a specific configuration, it can be said that the problem of reversing the predetermined effect is solved. However, such a specific configuration is not necessarily an essential requirement.

What is claimed is:

1. A method of evaluating a deviation of a trajectory of a primary electron beam in a primary optical system in an electron beam observation device including the primary optical system that irradiates a sample with the primary electron beam including a plurality of primary electrons and a secondary optical system that detects, by a detector, a secondary electron beam including a plurality of secondary electrons emitted from the sample irradiated with the primary electron beam, the method comprising the steps of:

irradiating an irradiation target with a primary electron beam generated by a multiple beam generation mechanism provided with a plurality of openings, and acquiring a first image formed by a secondary electron beam from the irradiation target, the first image including a plurality of first patterns each of which corresponding to each of the openings provided in the multiple beam generation mechanism;

calculating a first deviation amount between a position of each of the first patterns in the first image and a first target position of the first pattern;

irradiating with light a plurality of photoelectric converters each of which corresponding to each of the plurality of openings provided in the multiple beam generation mechanism and installed on a stage of the electron beam observation device, and acquiring a second image formed by an electron beam from the photoelectric converters, the second image including a plurality of second patterns each of which corresponding to each of the photoelectric converters;

calculating a second deviation amount between a position of each of the second patterns in the second image and a second target position of the second pattern; and obtaining a deviation of a trajectory of the primary electron beam in the primary optical system based on the first deviation amount and the second deviation amount.

2. The evaluation method according to claim 1, wherein a position of each of the first patterns in the first image deviates from the first target position depending on a deviation of trajectory of the primary electron beam in the primary optical system and a deviation of a trajectory of the secondary electron beam in the secondary optical system, and a position of each of the second patterns in the second image deviates from the second target position depending on a deviation of a trajectory of the secondary electron beam in the secondary optical system, but does not depend on a deviation of a trajectory of the primary electron beam in the primary optical system.

3. The evaluation method according to claim 1, wherein the irradiation target is a stage of the electron beam observation device.

4. The evaluation method according to claim 1, wherein the plurality of photoelectric converters are provided on a substrate, and the irradiation target is a part of the substrate where the photoelectric converters are not provided.

5. A method of evaluating a deviation of a trajectory of a primary electron beam in a primary optical system in an electron beam observation device including the primary optical system that irradiates a sample with the primary electron beam including a plurality of primary electrons and a secondary optical system that detects, by a detector, a secondary electron beam including a plurality of secondary electrons emitted from the sample irradiated with the primary electron beam, the method comprising the steps of:

irradiating an irradiation target with a primary electron beam from a plurality of electron sources, and acquiring a first image formed by a secondary electron beam from the irradiation target, the first image including a plurality of first patterns each of which corresponding to each of arrangements of the plurality of electron sources;

calculating a first deviation amount between a position of each of the first patterns in the first image and a first target position of the first pattern;

irradiating with light a plurality of photoelectric converters installed on a stage of the electron beam observation device and each corresponding to the arrangement of the plurality of electron sources, and acquiring a second image formed by an electron beam from the photoelectric converters, the second image including a plurality of second patterns each of which corresponding to each of the photoelectric converters;

calculating a second deviation amount between a position of each of the second patterns in the second image and a second target position of the second pattern; and obtaining a deviation of a trajectory of the primary electron beam in the primary optical system based on the first deviation amount and the second deviation amount.

6. The evaluation method according to claim 5, wherein a position of each of the first patterns in the first image deviates from the first target position depending on a deviation of a trajectory of the primary electron beam in the primary optical system and a deviation of a trajectory of the secondary electron beam in the secondary optical system, and a position of each of the second patterns in the second image deviates from the second target position depending on a deviation of a trajectory of the secondary electron beam in the secondary optical system, but does not depend on a deviation of a trajectory of the primary electron beam in the primary optical system.

7. The evaluation method according to claim 5, wherein the irradiation target is a stage of the electron beam observation device.

8. The evaluation method according to claim 5, wherein the plurality of photoelectric converters are provided on a substrate, and the irradiation target is a part of the substrate where the photoelectric converters are not provided.

\* \* \* \* \*